(12) United States Patent
Abe

(10) Patent No.: US 11,585,904 B2
(45) Date of Patent: Feb. 21, 2023

(54) DISTANCE MEASUREMENT DEVICE AND MOBILE APPARATUS

(71) Applicant: Sony Semiconductor Solutions Corporation, Kanagawa (JP)

(72) Inventor: Hideshi Abe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 717 days.

(21) Appl. No.: 16/610,299

(22) PCT Filed: May 8, 2018

(86) PCT No.: PCT/JP2018/017737
§ 371 (c)(1),
(2) Date: Nov. 1, 2019

(87) PCT Pub. No.: WO2019/012789
PCT Pub. Date: Jan. 17, 2019

(65) Prior Publication Data
US 2020/0081097 A1 Mar. 12, 2020

(30) Foreign Application Priority Data

Jul. 11, 2017 (JP) .............................. JP2017-135186

(51) Int. Cl.
*G01S 17/08* (2006.01)
*G01S 7/48* (2006.01)
(Continued)

(52) U.S. Cl.
CPC .......... *G01S 7/4816* (2013.01); *G01S 7/4808* (2013.01); *G01S 7/4811* (2013.01); *G01S 7/4863* (2013.01);
(Continued)

(58) Field of Classification Search
CPC ........ G01S 7/4865; G01S 17/08; G01S 17/42; G01S 7/4863; G01S 17/89; G01S 7/4811;
(Continued)

(56) References Cited

U.S. PATENT DOCUMENTS

| 6,128,445 A * | 10/2000 | Nakamura | G01C 3/085 356/3.14 |
| 6,191,845 B1 * | 2/2001 | Hayashi | G01C 3/08 356/3 |
| 2005/0030408 A1 * | 2/2005 | Ito | H04N 5/23296 348/340 |

(Continued)

FOREIGN PATENT DOCUMENTS

| JP | 11-153751 A | 6/1999 |
| JP | 2000-146523 A | 5/2000 |

(Continued)

OTHER PUBLICATIONS

Christiano Niclass, et al., "Design and characterization of a 256x64-pixel single-photon imager in CMOS for a MEMS based laser scanning time-of-flight sensor", Optics Express 11864, vol. 20, No. 11, May 21, 2012.

(Continued)

*Primary Examiner* — Tsion B Owens
(74) *Attorney, Agent, or Firm* — Michael Best & Friedrich LLP

(57) ABSTRACT

A distance measurement device according to the present disclosure includes: a laser irradiation unit that irradiates a measurement target with laser light; and a laser light receiving unit including a light receiving element that receives the laser light reflected by the measurement target on a pixel-by-pixel basis. Furthermore, the pitch of the unit pixels of the light receiving element varies with location in a light receiving pixel area. A mobile apparatus according to the (Continued)

present disclosure is equipped with a distance measurement device having the above configuration.

20 Claims, 12 Drawing Sheets

(51) Int. Cl.
    *G01S 7/481*     (2006.01)
    *G01S 7/4863*     (2020.01)
    *G01S 7/4865*     (2020.01)
    *G01S 17/89*     (2020.01)

(52) U.S. Cl.
    CPC ............ *G01S 7/4865* (2013.01); *G01S 17/08* (2013.01); *G01S 17/89* (2013.01)

(58) Field of Classification Search
    CPC .... G01S 7/4817; G01S 7/4816; G01S 17/931; G01S 7/4808; H01L 31/02; H01L 27/146; G01C 3/06
    See application file for complete search history.

(56) References Cited

U.S. PATENT DOCUMENTS

| | | | |
|---|---|---|---|
| 2006/0170802 A1* | 8/2006 | Misawa | H04N 5/3742 |
| | | | 348/E3.018 |
| 2016/0225812 A1 | 8/2016 | Elkhatib et al. | |
| 2020/0081097 A1* | 3/2020 | Abe | G01S 7/4865 |
| 2021/0124030 A1* | 4/2021 | Kawanishi | G01S 17/89 |

FOREIGN PATENT DOCUMENTS

| | | |
|---|---|---|
| JP | 2005-278133 A | 10/2005 |
| JP | 2006-238410 A | 9/2006 |
| JP | 2011-141142 A | 7/2011 |

OTHER PUBLICATIONS

Dries, John C., et al., "A 32x32 pixel FLASH laser radar system incorporating InGaAs PIN and APD detectors", Defense and Security, International Society for Optics and Photonics, 2004.

\* cited by examiner

DISTANCE MEASUREMENT DEVICE AND MOBILE APPARATUS

TECHNICAL FIELD

The present disclosure relates to a distance measurement device and a mobile apparatus.

BACKGROUND ART

A time-of-flight (TOF) method for measuring the time that elapses before laser light emitted toward a measurement target is reflected by the measurement target and returns is widely known as one of the measurement methods that are used in distance measurement devices (also called ranging devices in some cases) that measure the distance to a measurement target. The light receiving element that receives the reflected light from the measurement target may be a sensor in which unit pixels (hereinafter also referred to simply as "pixels") are arranged in a two-dimensional array, for example. A two-dimensional array sensor normally has a configuration in which the respective pixels are arranged at a uniform pitch (see Non-Patent Documents 1 and 2, for example).

Non-Patent Document 1 discloses a laser scanning TOF sensor in which a two-dimensional array sensor is used as a light receiving element in a system that scans a laser beam. Further, Non-Patent Document 2 discloses a flash laser radar system that is a system called Flash LiDAR (Light Detection And Ranging), and irradiates a measurement target with laser light using a surface irradiation light source and receives reflected light from the measurement target with a two-dimensional array sensor, like a camera.

CITATION LIST

Non-Patent Documents

Non-Patent Document 1: Christiano Niclass, et. al, "Design and characterization of a 256×64-pixel single-photon imager in CMOS for a MEMS based laser scanning time-of-flight sensor", OPTICS EXPRESS 11864, Vol. 20, No. 11, May 21, 2012

Non-Patent Document 2: Dries, John C., Brian Miles, and Roger Stettner, "A 32×32 pixel FLASH laser radar system incorporating InGaAs PIN and APD detectors", Defense and Security, International Society for Optics and Photonics, 2004

SUMMARY OF THE INVENTION

Problems to be Solved by the Invention

Meanwhile, a typical example of a distance measurement device that does not use a two-dimensional array sensor as a light receiving element is a distance measurement device that scans laser light with a scanning mechanism such as a rotating mirror, and receives reflected light returning from the measurement target with a single-pixel light receiving element. In the case of a distance measurement device of this kind, the scanning mechanism is mechanical, and has a large number of driving components. Therefore, the scanning mechanism is large and expensive, and has a problem in long-term reliability. From such a viewpoint, a distance measurement device using a two-dimensional array sensor as a light receiving element has been developed, and is promising as a future technology.

However, in a conventional distance measurement device using a two-dimensional array sensor as a light receiving element in particular, the respective pixels of the two-dimensional array sensor are arranged at a uniform pitch, and therefore, the incident angle of reflected light incident on each pixel of the light receiving element is narrower at a position that is farther away from the central portion of the light receiving element and is closer to the peripheral portion of the light receiving element. At the same time, the amount of the reflected light incident on each pixel of the light receiving element also decreases with the solid angle formed by each corresponding pixel, and the sensitivity at the peripheral portion of the light receiving element drops accordingly. Because of this, the difference in sensitivity between the central portion and the peripheral portion of the light receiving element becomes larger. As a result, the measurable distance is shorter at a position closer to the peripheral portion of the light receiving element, and the measurable viewing angle is narrower accordingly.

Therefore, the present disclosure aims to provide a distance measurement device having a wide viewing angle for a measurable distance, and a mobile apparatus including the distance measurement device.

Solutions to Problems

A distance measurement device according to the present disclosure for achieving the above objective includes:

a laser irradiation unit that irradiates a measurement target with laser light; and a laser light receiving unit including a light receiving element that receives the laser light reflected by the measurement target on a pixel-by-pixel basis, in which the pitch of the unit pixels of the light receiving element varies with location in a light receiving pixel area.

Further, a mobile apparatus according to the present disclosure for achieving the above objective is equipped with a distance measurement device, the distance measurement device including:

a laser irradiation unit that irradiates a measurement target with laser light; and a laser light receiving unit including a light receiving element that receives the laser light reflected by the measurement target on a pixel-by-pixel basis, in which the pitch of the unit pixels of the light receiving element varies with location in a light receiving pixel area.

The fact that the pitch of the unit pixels of the light receiving element varies with location in the light receiving pixel area means that the pitch of the unit pixels is not uniform in the entire light receiving pixel area. For example, the pitch of the unit pixels varies between the central portion and the peripheral portion of the light receiving element, or specifically, the pitch of the unit pixels is wider at a position that is farther away from the central portion and is closer to the peripheral portion of the light receiving element, to reduce the difference in sensitivity between the central portion and the peripheral portion of the light receiving element.

Effects of the Invention

According to the present disclosure, the difference in sensitivity between the central portion and the peripheral portion of the light receiving element can be reduced. Thus, a wide viewing angle can be achieved for a measurable distance. Note that the effects of the present disclosure are not necessarily limited to the effects described herein, and may include any of the effects described in this specification. Further, the advantageous effects described in this specification are merely examples, and the advantageous effects of the present disclosure are not limited to them and may include additional effects.

MODE FOR CARRYING OUT THE INVENTION

Figure 1:
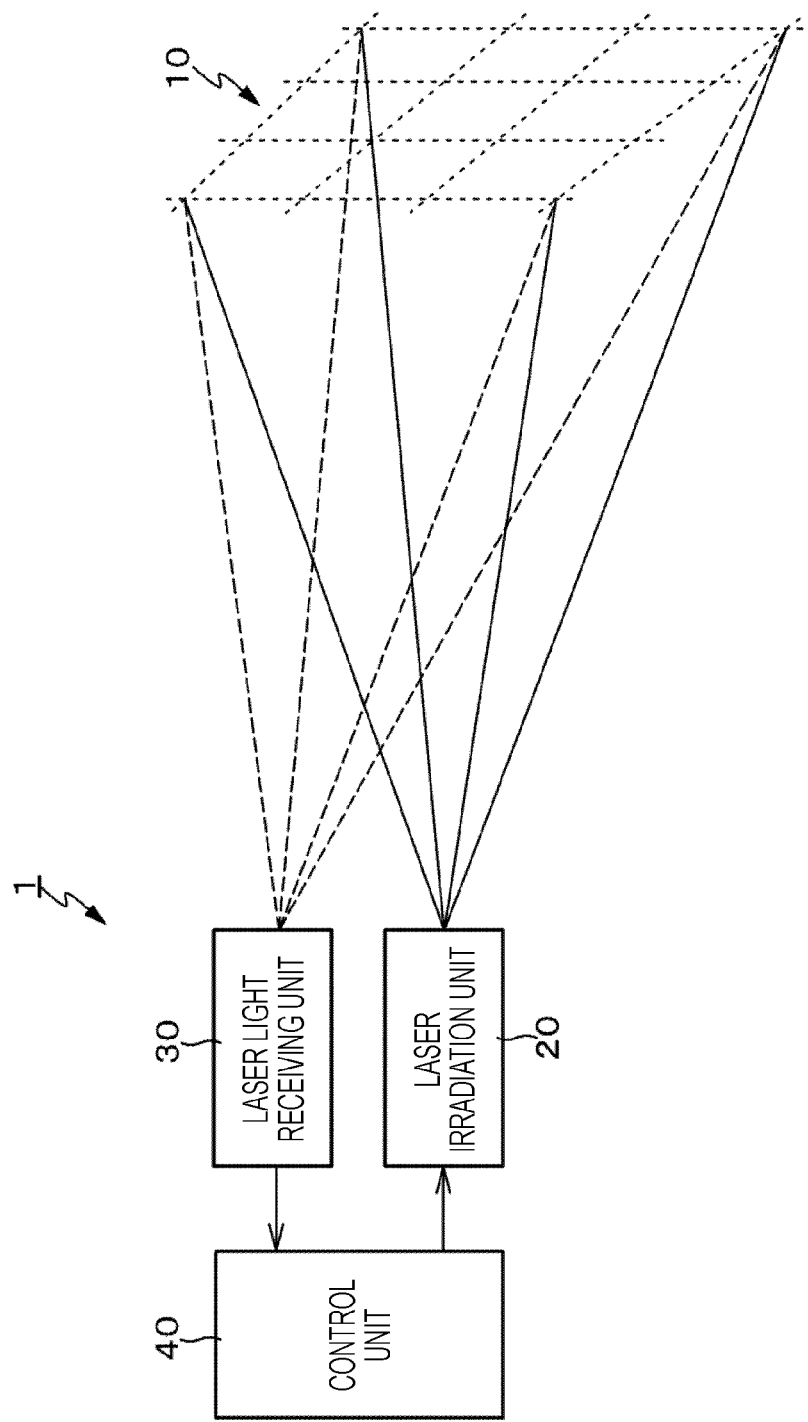
FIG. 1 is a schematic configuration diagram showing a distance measurement device according to an embodiment of the present disclosure.

The following is a detailed description of a mode for carrying out the technique according to the present disclosure (hereinafter referred to as an "embodiment"), with reference to the accompanying drawings. The technique according to the present disclosure is not limited to the embodiment, and various numerical values and the like used in the embodiment are examples. In the description below, like components or components having like functions are denoted by like reference numerals, and explanation of them will not be made more than once. Note that explanation will be made in the following order.
1. General description of a distance measurement device and a mobile apparatus of the present disclosure
2. Distance measurement device according to an embodiment 2-1. Reference Example 1 (an example case where the unit pixel pitch is uniform)
2-2. Reference Example 2 (an example of a laser beam scanning method using a one-dimensional array sensor)
2-3. Example 1 (an example of a two-dimensional array sensor)
2-4. Example 2 (an example case where the pixel pitch is varied pixel by pixel)
2-5. Example 3 (an example case where the pixel pitch is varied block by block)
2-6. Example 4 (an example case where the laser light receiving unit has a stack structure)
2-7. Example 5 (an example case where a unit pixel is formed with a plurality of sub-pixels)
3. Modifications
3-1. Modification 1
3-2. Modification 2
4. Mobile apparatus according to the present disclosure
4-1. Specific example (an example case where the mobile apparatus is an automobile)
5. Configurations embodying the present disclosure <General Description of a Distance Measurement Device and a Mobile Apparatus According to the Present Disclosure>

In a distance measurement device and a mobile apparatus according to the present disclosure, the pitch of unit pixels can be wider at a position that is farther away from the central portion of a light receiving element and is closer to the peripheral portion of the light receiving element. In this case, the pitch of the unit pixels may vary on a pixel-by-pixel basis. Alternatively, in a case where a plurality of adjacent unit pixels forms one block, the pitch of the unit pixels may vary on a block-by-block basis.

In the distance measurement device and the mobile apparatus according to the present disclosure including the preferred configuration described above, the light receiving element may be a two-dimensional array sensor in which unit pixels are two-dimensionally arranged in a first direction and a second direction intersecting the second direction. In this case, the pitch of the unit pixels of the light receiving element may vary in at least one of the first direction and the second direction.

Further, in the distance measurement device and the mobile apparatus according to the present disclosure including the preferred configuration described above, the sizes of the unit pixels of the light receiving element may vary with location in the light receiving pixel area. Here, the sizes of the unit pixels means the sizes of the light receiving surfaces of the unit pixels.

Further, in the distance measurement device and the mobile apparatus according to the present disclosure including the preferred configuration described above, the laser light receiving unit may have, for the respective pixels, circuit portions that process signals of the respective unit pixels of the light receiving element. In this case, it is preferable to form a stack structure in which the unit pixels are formed on a first substrate, the circuit portions are formed on a second substrate, and the first substrate and the second substrate are stacked on each other. Furthermore, as the stack structure is adopted, the pitch of the unit pixels formed on the first substrate can be made to differ from the pitch of the circuit portions formed on the second substrate.

Further, in the distance measurement device and the mobile apparatus according to the present disclosure including the preferred configuration described above, the light receiving element may be formed with a plurality of sub-pixels arranged at a constant pitch, and a unit pixel is formed with an appropriate number of sub-pixels adjacent to one another. In this case, the pitch of the unit pixel is determined by the pitch of the sub-pixels and the number of the sub-pixels constituting the unit pixel.

Furthermore, in the distance measurement device and the mobile apparatus according to the present disclosure, the laser irradiation unit may irradiate a measurement target while scanning laser light at an equiangular pitch. In this case, the unit pixels are preferably arranged in a pitch array corresponding to the equiangular pitch of the laser light. Further, the light receiving surface of the light receiving element is preferably curved with respect to the optical axis of the laser light receiving unit.

Distance Measurement Device According to an Embodiment

Figure 2:
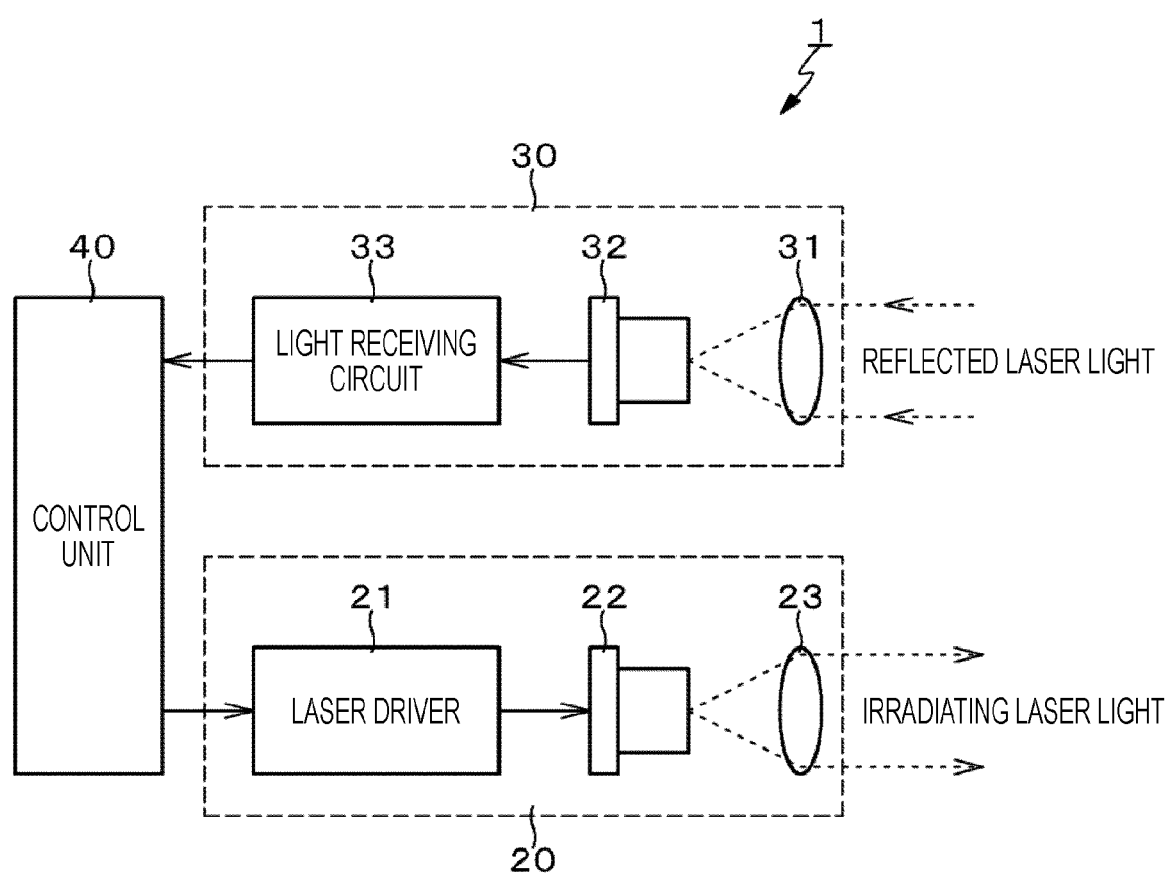
FIG. 2 is a block diagram showing the basic configuration of the distance measurement device according to an embodiment of the present disclosure.

FIG. 1 is a schematic configuration diagram showing a distance measurement device according to an embodiment of the present disclosure. FIG. 2 is a block diagram showing the basic configuration of the distance measurement device according to an embodiment of the present disclosure.

A distance measurement device 1 according to an embodiment of the present disclosure adopts the TOF method (time-of-flight method) as a measurement method for measuring the distance to a measurement target 10. By the TOF method, the time that elapses before laser light emitted toward the measurement target 10 is reflected by the measurement target 10 and return is measured. To carry out distance measurement by the TOF method, the distance measurement device 1 according to this embodiment includes a laser irradiation unit 20, a laser light receiving unit 30, and a control unit 40.

The laser irradiation unit 20 includes a laser driver 21, a laser light source 22, and a diffusion lens 23, and irradiates the measurement target 10 with laser light. The laser driver 21 drives the laser light source 22, under the control of the control unit 40. The laser light source 22 is formed with a semiconductor laser, for example, and emits laser light when driven by the laser driver 21. The diffusion lens 23 diffuses the laser light emitted from the laser light source 22, and irradiates the surface of the measurement target 10 with the laser light.

The laser light receiving unit 30 includes a light receiving lens 31, a light receiving element 32, and a light receiving circuit 33. On the basis of the laser light irradiation performed by the laser irradiation unit 20, the laser light receiving unit 30 receives reflected laser light that is reflected by the measurement target 10 and returns. The light receiving lens 31 gathers the reflected laser light from the measurement target 10 on the light receiving surface of the light receiving element 32. The light receiving element 32 receives the reflected laser light from the measurement target 10 through the light receiving lens 31 on a pixel-by-pixel basis, and performs photoelectric conversion.

Under the control of the control unit 40, the light receiving circuit 33 receives a light reception output from the light receiving element 32, to measure the time t that elapses before the laser light emitted from the laser irradiation unit 20 toward the measurement target 10 is reflected by the measurement target 10 and returns. Where L represents the distance to the measurement target 10, and c represents the velocity of light, the distance L to the measurement target 10 can be determined according to the following equation:

$$L=(c \times t)/2$$

The control unit 40 is formed with a central processing unit (CPU) or the like, for example, and controls the laser irradiation unit 20 and the laser light receiving unit 30. Note that, in the above described example, the light receiving circuit 33 measures the time t that elapses before laser light emitted from the laser irradiation unit 20 toward the measurement target 10 is reflected by the measurement target 10 and returns. However, the measurement may be carried out by the control unit 40.

The distance measurement device 1 having the above described configuration of this embodiment is characterized in that the pitch of the unit pixels of the light receiving element 32 varies with location in the light receiving pixel area. Here, the "light receiving pixel area" refers to the region in which the unit pixels that receive reflected laser light from the measurement target 10 are disposed.

The light receiving element 32 may be a two-dimensional array sensor (a so-called area sensor) in which unit pixels are arranged in a two-dimensional array, or a one-dimensional array sensor (a so-called line sensor) in which unit pixels are linearly arranged. A two-dimensional array sensor is used as the light receiving element 32, and simultaneous measurement for the respective pixels is carried out through surface irradiation by the laser irradiation unit 20, so that distance images can be acquired as dynamic images.

Meanwhile, the photoelectric conversion elements of the unit pixels may be high-speed and high-sensitivity avalanche photodiodes (APDs) in which photocurrent is multiplied by application of a reverse voltage, single photon avalanche diodes (SPADs) that detect single photons, or the like, for example.

The fact that the pitch of the unit pixels of the light receiving element 32 varies with location in the light receiving pixel area means that the pitch of the unit pixels is not uniform in the entire light receiving pixel area. For example, the pitch of the unit pixels varies between the central portion and the peripheral portion of the light receiving element 32, or specifically, the pitch of the unit pixels is wider at a position that is farther away from the central portion and is closer to the peripheral portion of the light receiving element 32, to reduce the difference in sensitivity between the central portion and the peripheral portion of the light receiving element 32. With this arrangement, a wide viewing angle can be set for any measurable distance.

Reference Example 1

Figure 3A:
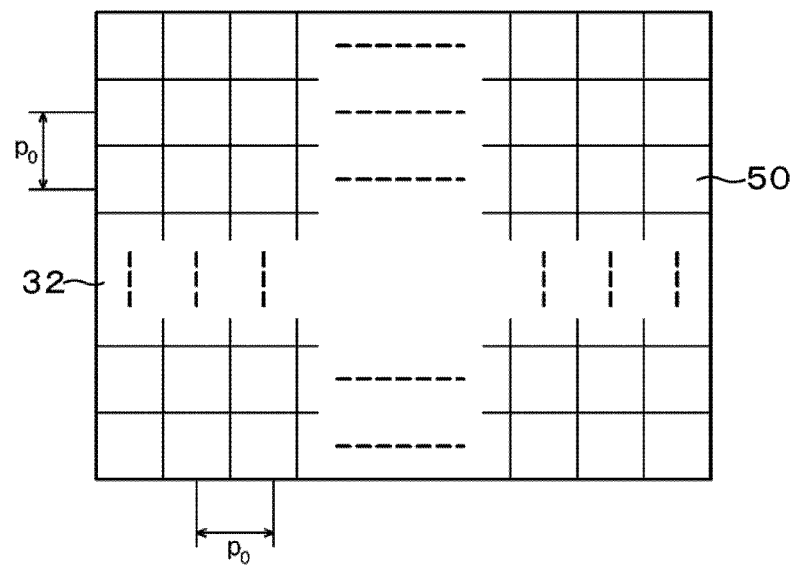
FIG. 3A is a plan view of the pixel array in a light receiving element according to Reference Example 1.

The pixel array in a light receiving element in the case of a distance measurement device according to a conventional technology in which the pitch of the unit pixels is uniform in the entire light receiving pixel area is now described as Reference Example 1. FIG. 3A is a plan view of the pixel array in a light receiving element according to Reference Example 1. Further, FIG. 3B is a diagram for explaining the incident angles of reflected light incident on the respective pixels in the case of the pixel array in a light receiving element according to Reference Example 1.

As shown in FIG. 3A, in a two-dimensional array sensor in which a plurality of unit pixels 50 is two-dimensionally arranged in a matrix, the pitch of the unit pixels 50 (pixel pitch) is set as equal intervals $p_0$ in the entire light receiving pixel area in the case of the pixel array in the light receiving element 32 according to Reference Example 1.

Figure 3B:
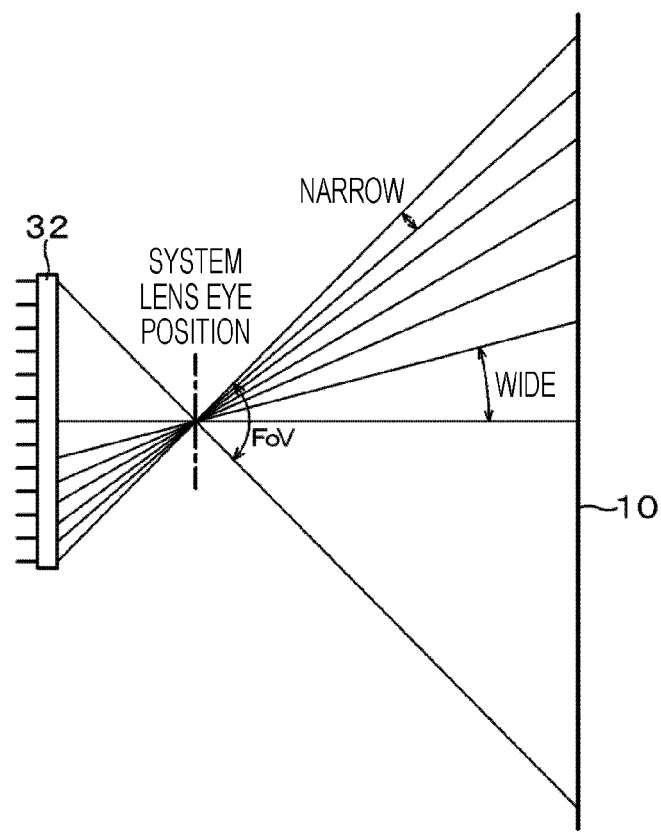
FIG. 3B is a diagram for explaining the incident angle of reflected light incident on each pixel in the case of the pixel array in the light receiving element according to Reference Example 1.

In a case where the pixel pitch is uniform in the entire light receiving pixel area as described above, the incident angle of reflected light that enters each pixel 50 of the light receiving element 32 from the measurement target 10 is narrower at a position that is farther away from the central portion and is closer to the peripheral portion of the light receiving element 32, as is apparent from FIG. 3B. At the same time, when the reflecting surface of the measurement target 10 is a flat surface, the optical path length of the reflected light reaching each pixel 50 of the light receiving element 32 from the measurement target 10 is greater at a position that is farther away from the central portion and is closer to the peripheral portion of the light receiving element 32. Because of this, the amount of reflected light incident on each pixel 50 of the light receiving element 32 also decreases with the solid angle formed by each corresponding pixel 50, and the sensitivity at the peripheral portion of the light receiving element 32 drops accordingly.

As described above, the angular pitch of the reflected light incident on the light receiving element 32 is governed by the pixel pitch of the light receiving element 32, and therefore, the sensitivity difference between the central portion and the peripheral portion of the light receiving element 32 is large. As a result, the measurable distance is shorter at a position closer to the peripheral portion of the light receiving element 32, and the measurable viewing angle is narrower accordingly. It is inevitable that the angular pitch of the reflected light incident on the light receiving element 32 is governed by the pixel pitch of the light receiving element 32, as long as the pixel pitch is uniform in the entire light receiving pixel area. The same applies whether the light receiving element 32 is a two-dimensional array sensor or a one-dimensional array sensor.

A distance measurement device can be mounted and used in an automobile, for the purpose of automatic driving or the like, for example. In the distance measurement device (a distance measurement system) in this case, a 360-degree ranging field of view (imaging field of view) FoV is required. Even in a case where a 360-degree ranging field of view FoV is divided and shared by four distance measurement devices, at least a 90-degree ranging field of view FoV, or at least a 100-degree ranging field of view FoV is required so as to reduce the blind area or to secure a reasonable overlap region.

In the light receiving element 32 formed with a two-dimensional array sensor in which the pixel pitch is uniform in the entire light receiving pixel area, if the ranging field of view FoV is 100 degrees, the angular pitch is 0.24 degree in the central portion of the light receiving element 32, but is 0.11 degree in the peripheral portion of the light receiving element 32, for example. As a result, the sensitivity is almost halved, and the sensitivity difference between the central portion and the peripheral portion of the light receiving element 32 is almost doubled.

Reference Example 2

Figure 4:
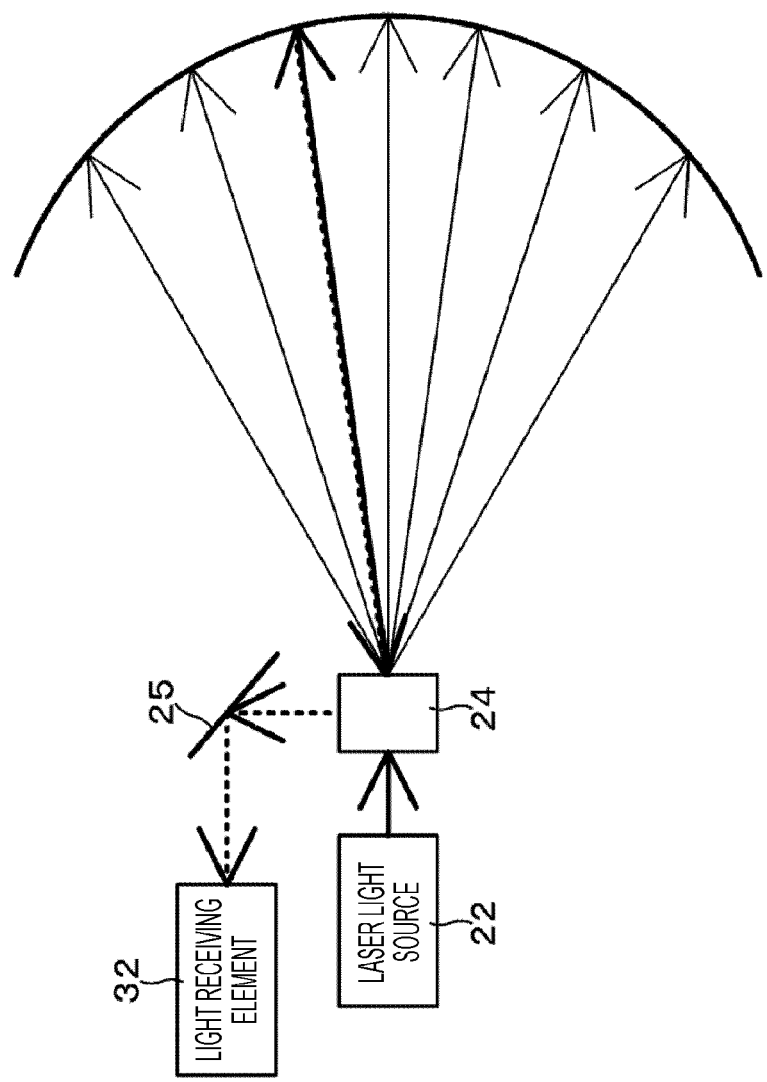
FIG. 4 is a schematic configuration diagram showing a laser-beam-scanning distance measurement device according to Reference Example 2.

Next, a laser-beam-scanning distance measurement device in which the light receiving element 32 is formed with a one-dimensional array sensor is described as Reference Example 2. FIG. 4 is a schematic configuration diagram showing the laser-beam-scanning distance measurement device according to Reference Example 2.

The laser-beam-scanning distance measurement device scans a laser beam (laser light) emitted from the laser light source 22 with a beam scanning unit 24, for example, and the returning beam reflected by the measurement target is reflected by a mirror 25 and is guided to the light receiving element 32. The beam scanning unit 24 is formed with a scanning mechanism including a rotating mirror and a microelectromechanical system (MEMS), a beam splitter that splits a returning beam reflected by the measurement target and guides the beam to the mirror 25, and the like. In the case of the laser beam scanning method according to Reference Example 2, the light receiving element 32 is formed with a single pixel.

In this laser-beam-scanning distance measurement device, laser beam scanning is normally performed at an angular pitch with equal intervals (an equiangular pitch), so that data can be acquired at equal intervals both in the central portion and in the edge portion of the field of view. However, being a mechanical structure, the scanning mechanism is large and expensive, and has a problem in long-term reliability. Further, since nonlinear control is required so that the laser beam scan pitch is matched with the laser beam emission timing in accordance with the pixel pitch, the control becomes very complicated. Particularly, in a mechanical scanning mechanism such as a rotating mirror or a MEMS that uses rotation or vibration, it is more difficult to control the scanning angular velocity, and therefore, it is difficult to obtain a distance measurement device having a wide viewing angle for a measurable distance.

In view of the problems with Reference Example 1 and Reference Example 2 described above, this embodiment is designed to obtain a wide viewing angle for a measurable distance. Specifically, in this embodiment, the pitch of the unit pixels 50 in the pixel array in the light receiving element 32 is made to vary with location in the light receiving pixel area. The light receiving element 32 may be a two-dimensional array sensor, or may be a one-dimensional array sensor. Specific examples of the pixel array in the light receiving element 32 will be described below.

Example 1

Figure 5:
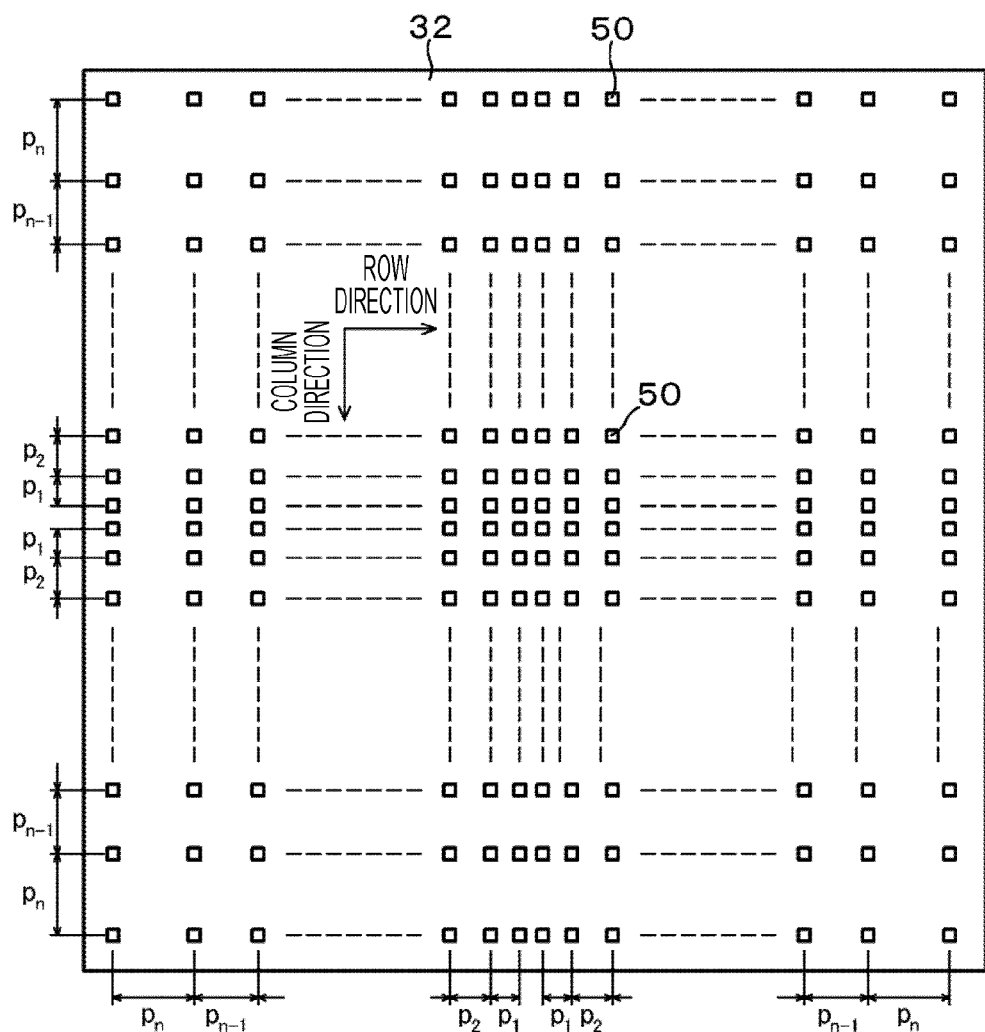
FIG. 5 is a plan view of the pixel array in a light receiving element according to Example 1.

Example 1 is an example case where the light receiving element 32 is a two-dimensional array sensor. FIG. 5 is a plan view of the pixel array in a light receiving element according to Example 1. Note that, in FIG. 5, the planar shape of each unit pixel 50 is shown as a square. However, the shape is not necessarily a square, and may be some other shape such as a rectangle or a hexagon (a honeycomb).

As shown in FIG. 5, the light receiving element 32 according to Example 1 is a two-dimensional array sensor in which a plurality of unit pixels 50 is two-dimensionally arranged in a matrix. Further, the pixel array is such that the pitch (the pixel pitch) of the unit pixels 50 is varied with location in the light receiving pixel area. Specifically, in the pixel array in the light receiving element 32 according to Example 1, the angular pitch of reflected light incident on the light receiving element 32 is governed by the pixel pitch in the light receiving element 32, and therefore, the pixel pitch is varied so that the incident angle of reflected light to the respective pixels 50 becomes a constant angle.

For example, in the light receiving pixel area of the pixel array in the light receiving element 32 according to Example 1, the pixel pitch is set so that $p_1 < p_2 < p_3, \ldots, p_{n-1} < p_n$ is established, where $p_1, p_2, p_3, \ldots, p_{n-1}$, and $p_n$ represent the pixel pitch in a direction from the central portion toward the peripheral portion. That is, in the light receiving pixel area of the light receiving element 32 according to Example 1, the pixel pitch in the pixel array becomes gradually wider in a direction from the central portion toward the peripheral portion, so that the incident angle of reflected light to the respective pixels 50 becomes a constant angle.

As described above, in the light receiving pixel area of the pixel array in the light receiving element 32 according to Example 1, the pixel pitch is varied (changed) on a pixelby-pixel basis, so that the incident angle of reflected light to the respective pixels 50 of the light receiving element 32 becomes a constant angle. As a result, the difference in sensitivity between the central portion and the peripheral portion of the light receiving element 32 can be reduced. Thus, a wide viewing angle can be achieved for a measurable distance.

Note that, in Example 1, the pixel pitch is varied in both the row direction (the first direction) and the column direction (the second direction) in the light receiving element 32 formed with a two-dimensional array sensor. However, the pixel pitch is not necessarily varied in the two directions, and may be varied at least either in the row direction or in the column direction. Further, in a case where a configuration in which the pixel pitch is varied in both the row direction and the column direction is adopted, the pixel pitch in the row direction and the pixel pitch in the column direction are not necessarily the same (the same pitch).

Furthermore, in Example 1, all the unit pixels 50 have the same unit pixel size (light receiving surface size). However, difference sizes may be set depending on location in the light receiving pixel area. The actions and the effects of the setting of a different size for a unit pixel 50 depending on the location in the light receiving pixel area will be described later in Example 2.

Figure 6:
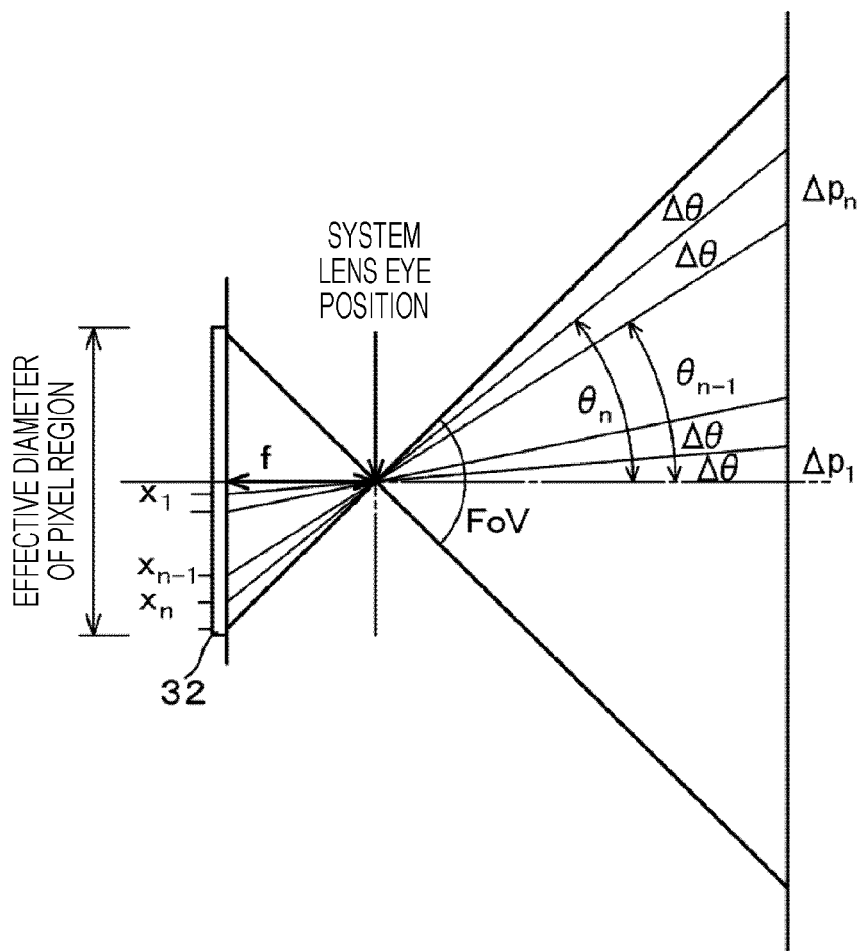
FIG. 6 is a diagram for explaining the incident angle of reflected light incident on each pixel in the case of the pixel array in the light receiving element according to Example 1.

The incident angle of reflected light incident on each pixel 50 in the pixel array in the light receiving element 32 according to Example 1 is now described, with reference to FIG. 6. FIG. 6 is a diagram for explaining the incident angle of reflected light incident on each pixel 50 in the pixel array in the light receiving element 32 according to Example 1.

Here, the focal length of the lens optical system in the laser light receiving unit 30 is represented by f, the angular pitch (the angular resolution) of reflected light incident on each pixel 50 is represented by $\Delta\theta$, and the pixel pitch is represented by $\Delta p$. Note that, in FIG. 5, $\Delta$ is omitted from the pixel pitch. Further, in FIGS. 5 and 6, the pixel number at the center of the light receiving element 32 is $x_1$, and the pixel number at a furthest end is $x_n$.

The pixel pitch $p_1$ of the pixel $x_1$ located at the center of the light receiving element 32 is expressed as:

$$p_1 = \{\tan(\Delta\theta) - \tan(0)\} \times f$$

The pixel pitch $p_i$ of the ith pixel $x_i$ from the center is expressed as:

$$p_i = \{\tan(i \times \Delta\theta) - \tan((i-1) \times \Delta\theta)\} \times f$$

The pixel pitch is varied in the light receiving pixel area so that the above relational expressions are satisfied. However, there is no need to form the pitch completely based on the relational expressions, and it is possible to achieve the predetermined objective, as long as the pixel array is such that the pixel pitch becomes at least wider at a position that is farther away from the central portion (the center) and is closer to the peripheral portion (the furthest end) of the light receiving element 32.

The setting of the pixel pitch in the pixel array in the light receiving element 32 according to Example 1 is now specifically described with numerical examples. For example, the necessary ranging field of view FoV is 100 degrees, the angular pitch $\Delta\theta$ is 0.2 degrees, and the focal length f of the lens optical system is 17 mm. In this case, the pixel pitch $p_1$ of the pixel $x_1$ located at the center is expressed as:

$$p_1 = (\tan 0.2 - \tan 0) \times 17 \text{ mm}$$

$\approx 59$ μm Further, where n=250, the pixel pitch $p_n$ of the pixel $x_n$ located at the furthest end is expressed as:

$$p_n = (\tan 50 - \tan 49.8) \times 17 \text{ mm}$$

$\approx 143$ μm

Example 2

Figure 7A:
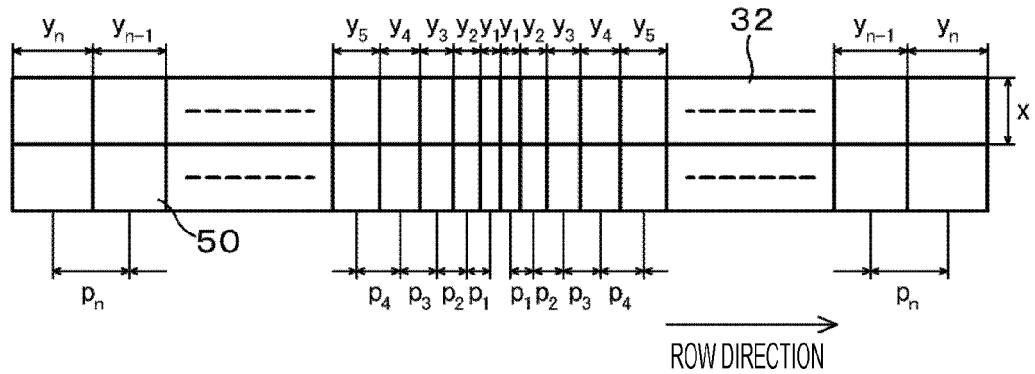
FIG. 7A is a plan view (part 1) of the pixel array in a light receiving element according to Example 2.
Figure 7B:
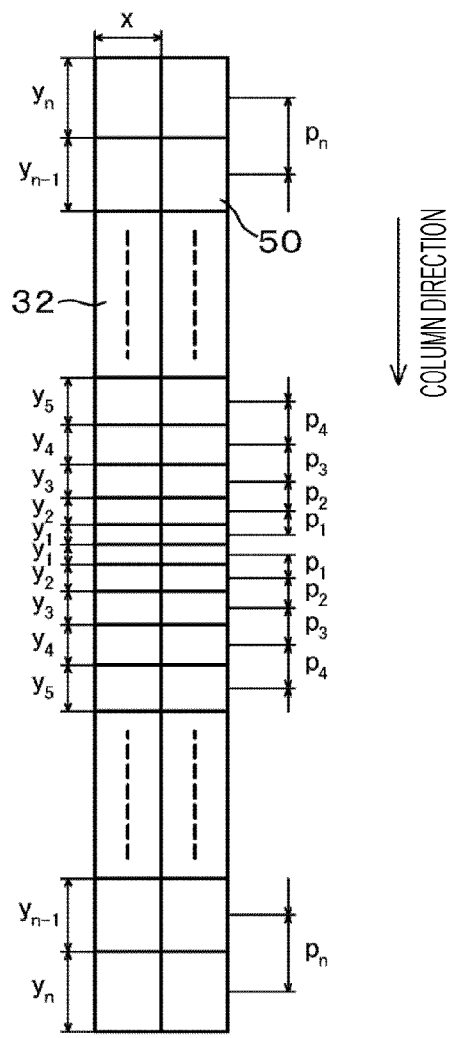
FIG. 7B is a plan view (part 2) of the pixel array in a light receiving element according to Example 2.

Example 2 is an example case where the pixel pitch in the light receiving element 32 formed with a one-dimensional array sensor is varied on a pixel-by-pixel basis. FIG. 7A is a plan view (part 1) of the pixel array in the light receiving element 32 according to Example 2. FIG. 7B is a plan view (part 2) of the pixel array in the light receiving element 32 according to Example 2. Note that, in FIGS. 7A and 7B, the planar shape of each unit pixel 50 is shown as a rectangle. However, the shape is not necessarily a rectangle, and may be some other shape such as a square or a hexagon.

The pixel array shown in FIG. 7A is an example of a one-dimensional array sensor in which the unit pixels 50 of the light receiving element 32 are arranged in two rows in the row direction (along the row direction), for example. The pixel array shown in FIG. 7B is an example of a one-dimensional array sensor in which the unit pixels 50 of the light receiving element 32 are arranged in two columns in the column direction (along the column direction), for example.

In the pixel array in the light receiving element 32 according to Example 2, the pixel pitch is varied so that the incident angle of reflected light to the respective unit pixels 50 becomes a constant angle in the light receiving element 32 formed with the one-dimensional array sensor shown in FIGS. 7A and 7B. For example, in the light receiving pixel area, the pixel pitch is set so that $p_1 < p_2 < p_3, \ldots, p_{n-1} < p_n$ is established, where $p_1, p_2, p_3, \ldots, p_{n-1}$, and $p_n$ represent the pixel pitch in a direction from the central portion toward the peripheral portion.

As described above, in the light receiving pixel area of the pixel array in the light receiving element 32 according to Example 2, the pixel pitch is varied (changed) on a pixel-by-pixel basis, so that the incident angle of reflected light to the respective pixels 50 of the light receiving element 32 becomes a constant angle. As a result, the difference in sensitivity between the central portion and the peripheral portion of the light receiving element 32 can be reduced. Thus, a wide viewing angle can be achieved for a measurable distance.

Further, in the pixel array in the light receiving element 32 according to Example 2, the size of a unit pixel 50 (the light receiving surface size) in the light receiving element 32 is varied with location in the light receiving pixel area. In the case of the light receiving element 32 formed with the one-dimensional array sensor shown in FIG. 7A, the respective pixels have the same dimension x in the column direction of the unit pixels 50, and the dimensions in the row direction are set so that $y_1 < y_2 < y_3, \ldots, y_{n-1} < y_n$ is established, where $y_1, y_2, y_3, \ldots, y_{n-1}$, and $y_n$ represent the dimensions in the row direction, from the central portion toward the peripheral portion, for example.

In the case of the light receiving element 32 formed with the one-dimensional array sensor shown in FIG. 7B, the respective pixels have the same dimension x in the row direction of the unit pixels 50, and the dimensions in the row direction are set so that $y_1 < y_2 < y_3, \ldots, y_{n-1} < y_n$ is established, where $y_1, y_2, y_3, \ldots, y_{n-1}$, and $y_n$ represent the dimensions in the column direction, from the central portion toward the peripheral portion, for example. That is, in either of the cases shown in FIG. 7A and FIG. 7B, the sizes of the unit pixels 50 are set so as to become larger at a position that is farther away from the central portion and is closer to the peripheral portion in the light receiving pixel area.

As described above, the optical path length of reflected light from the measurement target to each pixel 50 of the light receiving element 32 becomes longer at a position that is farther away from the central portion and is closer to the peripheral portion of the light receiving element 32. Therefore, the amount of reflected light incident on each pixel 50 decreases with the solid angle formed by each corresponding pixel 50, and the sensitivity at the peripheral portion of the light receiving element 32 drops accordingly. Because of this, the difference in sensitivity between the central portion and the peripheral portion of the light receiving element 32 becomes larger. As a result, the measurable distance is shorter at a position closer to the peripheral portion of the light receiving element 32, and the measurable viewing angle is narrower accordingly.

In the pixel array in the light receiving element 32 according to Example 2, on the other hand, the sizes of the unit pixels 50 are set so as to become larger at a position that is farther away from the central portion and is closer to the peripheral portion in the light receiving pixel area. With this arrangement, the optical path length of reflected light from the measurement target to each pixel 50 of the light receiving element 32 can compensate for the decrease caused in the amount of light by the increase in the optical path length that is longer at a position that is farther away from the central portion and is closer to the peripheral portion of the light receiving element 32. Thus, the difference in sensitivity between the central portion and the peripheral portion of the light receiving element 32 can be reduced.

In setting the sizes of the unit pixels 50 so as to become larger at a position that is farther away from the central portion and is closer to the peripheral portion, it is preferable to set each pixel size in accordance with the degree of change in the reflected light path length that is longer at a position that is farther away from the central portion and is closer to the peripheral portion of the light receiving element 32.

Example 3

Figure 8:
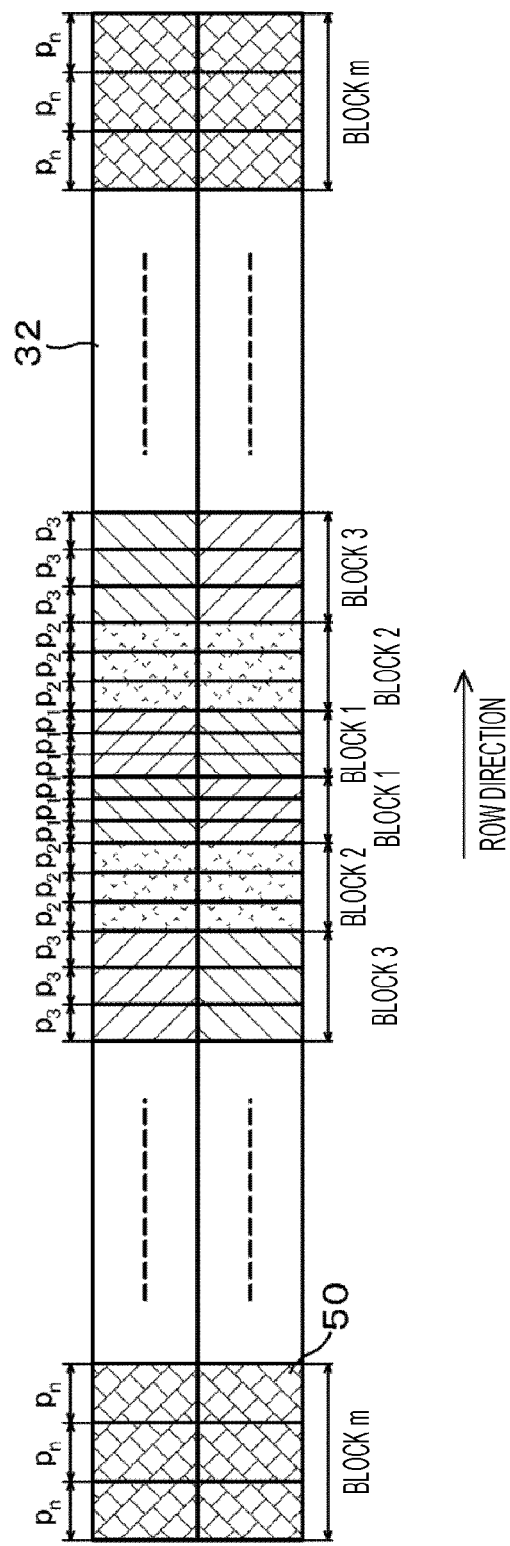
FIG. 8 is a plan view of the pixel array in a light receiving elements according to Example 3.

Example 3 is an example case where the pixel pitch in the light receiving element 32 formed with a one-dimensional array sensor is varied on a block-by-block basis. FIG. 8 is a plan view of the pixel array in a light receiving element 32 according to Example 3. Note that, in FIG. 8, the planar shape of each unit pixel 50 is shown as a rectangle. However, the shape is not necessarily a rectangle, and may be some other shape such as a square or a hexagon.

The pixel array in the light receiving element 32 according to Example 3 is an example of a one-dimensional array sensor in which unit pixels 50 are arranged in two rows in the row direction (along the row direction), for example. In this one-dimensional array sensor, an appropriate number of unit pixels 50 adjacent to one another, such as three unit pixels 50, form one block, for example. Specifically, in the direction from the central portion toward the peripheral portion, a block 1, a block 2, a block 3, . . . , and a block m are formed, with each block being formed with three unit pixels 50. In each block, the pitch (the size in the row direction) of the three unit pixels 50 is the same.

Furthermore, in the pixel array in the light receiving element 32 according to Example 3, the pixel pitch is set so that $p_1 < p_2, \ldots, p_{n-1} < p_n$ is established, where $p_1$ represents the pixel pitch in the block 1, $p_2$ represents the pixel pitch in the block 2, and $p_m$ represents the pixel pitch in the block m. In other words, in the light receiving pixel area, the pixel array is such that the pixel pitch becomes wider on a block-by-block basis from the central portion toward the peripheral portion. In this case, the pixel size is also larger at a position that is farther away from the central portion and is closer to the peripheral portion.

As described above, in the light receiving pixel area of the pixel array in the light receiving element 32 according to Example 3, the pixel pitch is varied (changed) on a block-by-block basis, so that the incident angle of reflected light to the respective pixels 50 of the light receiving element 32 becomes a constant angle. As a result, the difference in sensitivity between the central portion and the peripheral portion of the light receiving element 32 can be reduced. Thus, a wide viewing angle can be achieved for a measurable distance.

Note that the case of a one-dimensional array sensor in which the unit pixels 50 are arranged in two rows in the row direction has been described as an example. However, a one-dimensional array sensor in which the unit pixels 50 are arranged in two columns in the column direction, for example, can achieve actions and effects that are similar to the above, as long as the one-dimensional array sensor has a basic configuration similar to the above.

Example 4

Figure 9A:
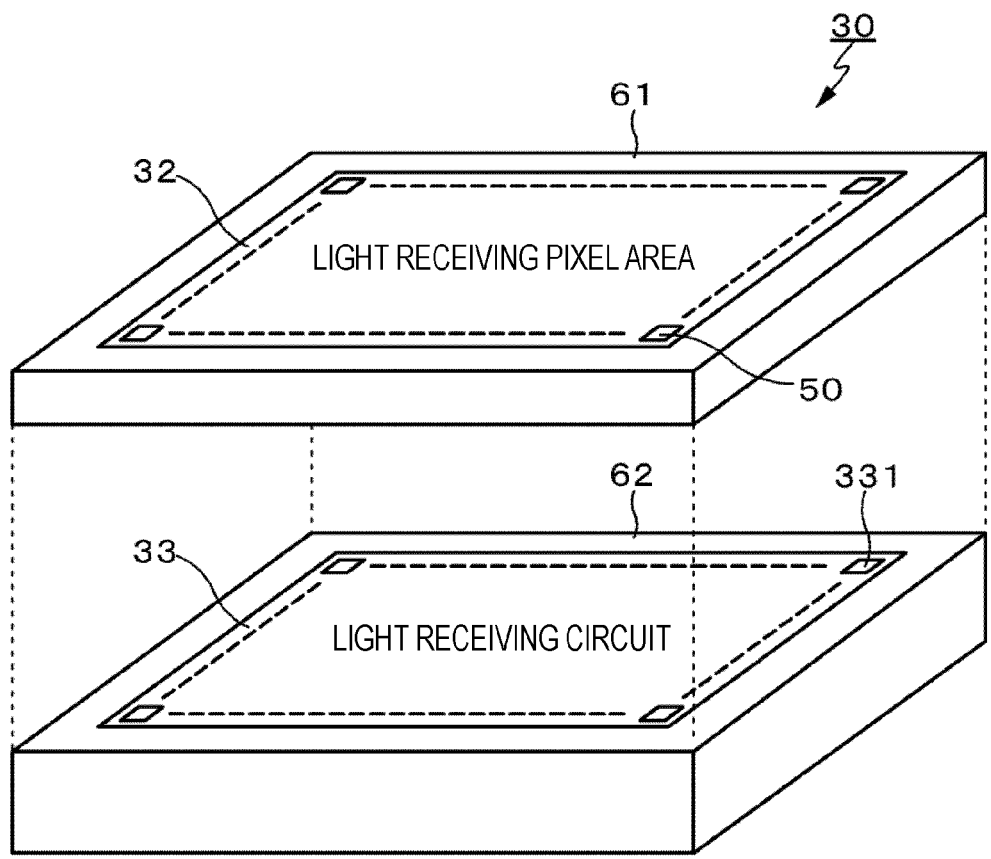
FIG. 9A is an exploded perspective view schematically showing the stack structure of a laser light receiving unit according to Example 4.
Figure 9B:
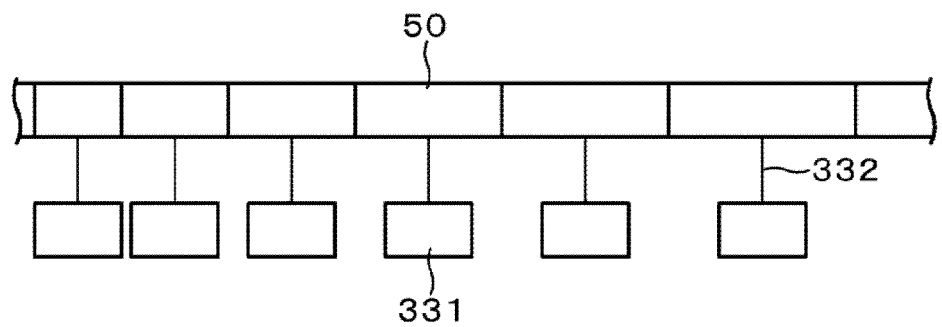
FIG. 9B is a schematic side view showing the connection relationship between unit pixels and circuit portions in the laser receiving unit of the stack structure according to Example 4.

Example 4 is an example case where the laser light receiving unit 30 of the distance measurement device 1 according to this embodiment has a stack structure. FIG. 9A is an exploded perspective view of the laser light receiving unit 30 having a stack structure according to Example 4. FIG. 9B shows the connection relationship between the unit pixels and the circuit portions in the laser light receiving unit having a stack structure according to Example 4.

As shown in FIG. 7A, the laser light receiving unit 30 of the distance measurement device 1 according to this embodiment has a stack structure in which the light receiving element 32 is formed on a first substrate 61, the light receiving circuit 33 is formed on a second substrate 62, and the first substrate 61 and the second substrate 62 are stacked on one another. More specifically, the unit pixels 50 of the light receiving element 32 are formed on the first substrate 61. The light receiving circuit 33 includes, for the respective pixels, circuit portions 331 that process the signals of the respective unit pixels 50 of the light receiving element 32, and the respective circuit portions 331 of the light receiving circuit 33 have almost the same circuit sizes and are formed on the second substrate 62.

Here, in a case where the unit pixels 50 are two-dimensionally arranged at equal intervals over the entire light receiving pixel area on the first substrate 61 (see FIG. 3A), the respective circuit portions 331 of the light receiving circuit 33 are also two-dimensionally arranged at equal intervals on the second substrate 62 stacked on the first substrate 61, in accordance with the respective unit pixels 50. By virtue of this stack structure of the laser light receiving unit 30, the signals of the respective unit pixels 50 based on surface irradiation performed by the laser irradiation unit 20 can be read with the respective circuit portions 331 of the light receiving circuit 33 at the same timing, and be then processed.

In the stack structure according to Example 4, in a case where the pixel pitch and the pixel size of the unit pixels 50 are varied on a pixel-by-pixel basis as in Example 2 (see FIGS. 7A and 7B), for example, the respective circuit portions 331 of the light receiving circuit 33 are made to have substantially the same circuit sizes, and the pitch of the circuit portions 331 is varied only by connection of wiring lines 332, as shown in FIG. 9B. This is a structure that can be formed because the laser light receiving unit 30 has a stack structure.

That is, in the stack structure according to Example 4, because of the stack structure, the pitch of the unit pixels 50 formed on the first substrate 61, and the pitch 331 of the circuit portions formed on the second substrate 62 can be made to differ from each other only by the connection of the wiring lines 332. As a result, even if the pixel pitch of the unit pixels 50 varies, the uniform circuit sizes of the respective circuit portions 331 of the light receiving circuit 33 can be maintained. Furthermore, the respective circuit portions 331 of the light receiving circuits 33 can be disposed on the second substrate 62, without being affected by the pitch of the unit pixels 50.

Example 5

Figure 10:
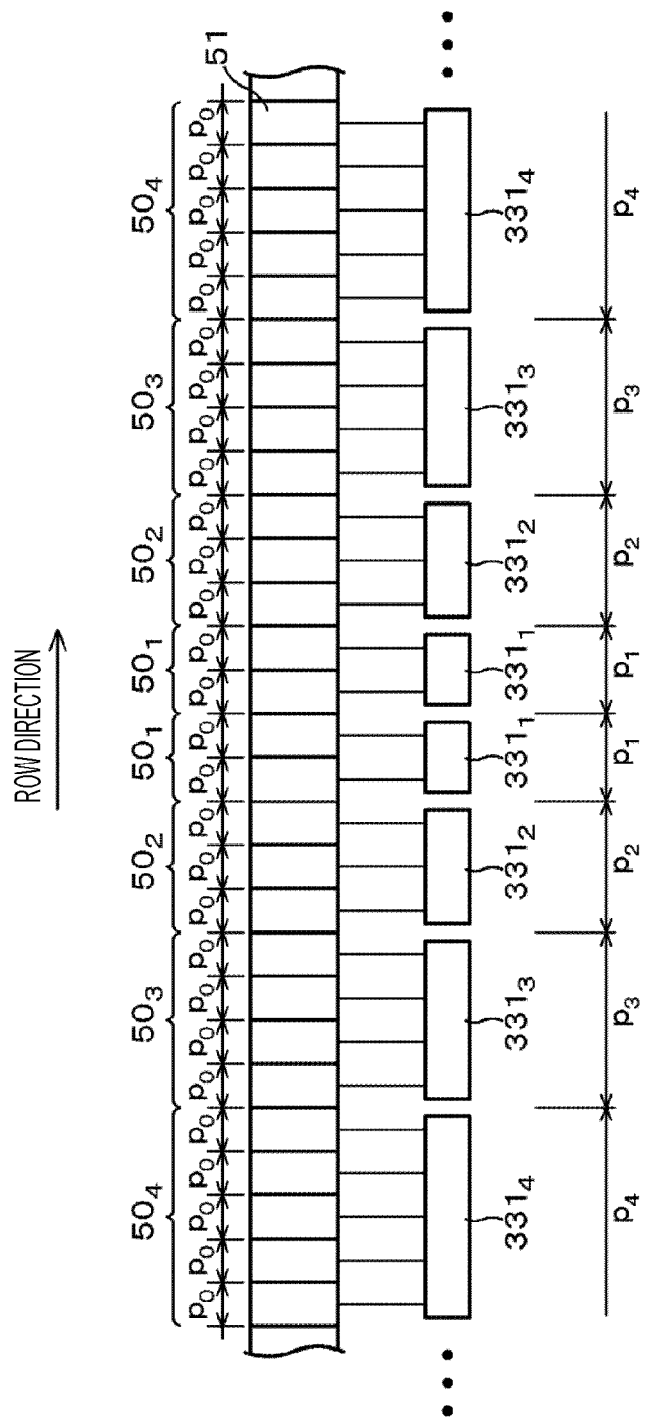
FIG. 10 is a plan view of the pixel array in a light receiving element according to Example 5.

Example 5 is an example case where each unit pixel 50 is formed with a plurality of sub-pixels in the light receiving element 32 formed with a one-dimensional array sensor. FIG. 10 is a plan view of the pixel array in the light receiving element 32 according to Example 5. Note that, in FIG. 10, the planar shape of each unit pixel 50 is shown as a rectangle. However, the shape is not necessarily a rectangle, and may be some other shape such as a square or a hexagon.

The pixel array in the light receiving element 32 according to Example 5 is an example of a one-dimensional array sensor in which a plurality of sub-pixels 51 forming unit pixels 50 are arranged in one row at a certain pitch $p_0$ in the row direction (along the row direction), for example. In this one-dimensional array sensor, each unit pixel 50 is formed with an appropriate number of sub-pixels 51 adjacent to one another in the plurality of sub-pixels 51. In this case, the appropriate number of sub-pixels 51 function as one unit pixel 50, being electrically connected in parallel to one another in a circuit portion 331.

In the example shown in FIG. 10, in the light receiving element 32 formed with a one-dimensional array sensor, the number of sub-pixels 51 constituting a unit pixel 50 is varied from two to three to four, . . . , in the direction from the central portion toward the peripheral portion. Specifically, the unit pixel $50_1$ at the center of the sensor is formed with two sub-pixels 51, the second unit pixel $50_2$ from the center of the sensor is formed with three sub-pixels 51, and the third unit pixel $50_3$ from the center of the sensor is formed with four sub-pixels 51, and so on.

In this arrangement, the pitch of a unit pixel 50 is determined by the pitch $p_0$ of the sub-pixels 51 and the number of the sub-pixels 51 constituting the unit pixel 50. In the above example, the pitch (the dimension in the row direction) $p_1$ of the unit pixel $50_1$ is $p_0 \times 2$, the pitch $p_2$ of the unit pixel $50_2$ is $p_0 \times 3$, the pitch $p_3$ of the unit pixel $50_3$ is $p_0 \times 3$, and the same applies to the pitch of each of the other unit pixels. In this manner, the pitch of a unit pixel is determined by the pitch $p_0$ of the sub-pixels 51 and the number of the sub-pixels 51.

In the pixel array in the light receiving element 32 according to Example 5, the size (the light receiving surface size) of the unit pixel $50_3$, as well as the pitch of the unit pixel $50_3$, can be changed in accordance with the pitch $p_0$ of the sub-pixels 51 and the number of the sub-pixels 51 constituting the unit pixel 50. Furthermore, in the light receiving pixel area, the numbers of the sub-pixels 51 constituting the unit pixels 50 are set so that the pitch and the size of a unit pixel 50 become larger at a position that is farther away from the central portion and is closer to the peripheral portion. In this manner, the difference in sensitivity between the central portion and the peripheral portion of the light receiving element 32 can be reduced, and thus, a wide viewing angle can be obtained for a measurable distance.

Note that the case of a one-dimensional array sensor in which the unit pixels 50 are arranged in one row in the row direction has been described as an example. However, a one-dimensional array sensor in which the unit pixels 50 are arranged in one column in the column direction, for example, can achieve actions and effects that are similar to the above, as long as the one-dimensional array sensor has a basic configuration similar to the above.

<Modifications>

Although the technology according to the present disclosure has been described so far on the basis of preferred examples, the technology according to the present disclosure is not limited to those examples. The configurations and the structures of the distance measurement devices described in the above embodiments are merely examples, and can be modified as appropriate.

[Modification 1]

For example, in each of the above examples, a distance measurement device that has the laser light source 22 as the surface light source has been described as an example. However, the technology according to the present disclosure can also be applied to a laser-beam-scanning distance measurement device (see FIG. 4) formed with a MEMS, a mirror, an optical phased array (OPA), and the like. In the case of a laser-beam-scanning distance measurement device, laser beam scanning is performed at an equiangular pitch (an angular pitch at equal intervals), and therefore, the pitch array of the unit pixels 50 preferably corresponds to the equiangular pitch.

[Modification 2]

Figure 11:
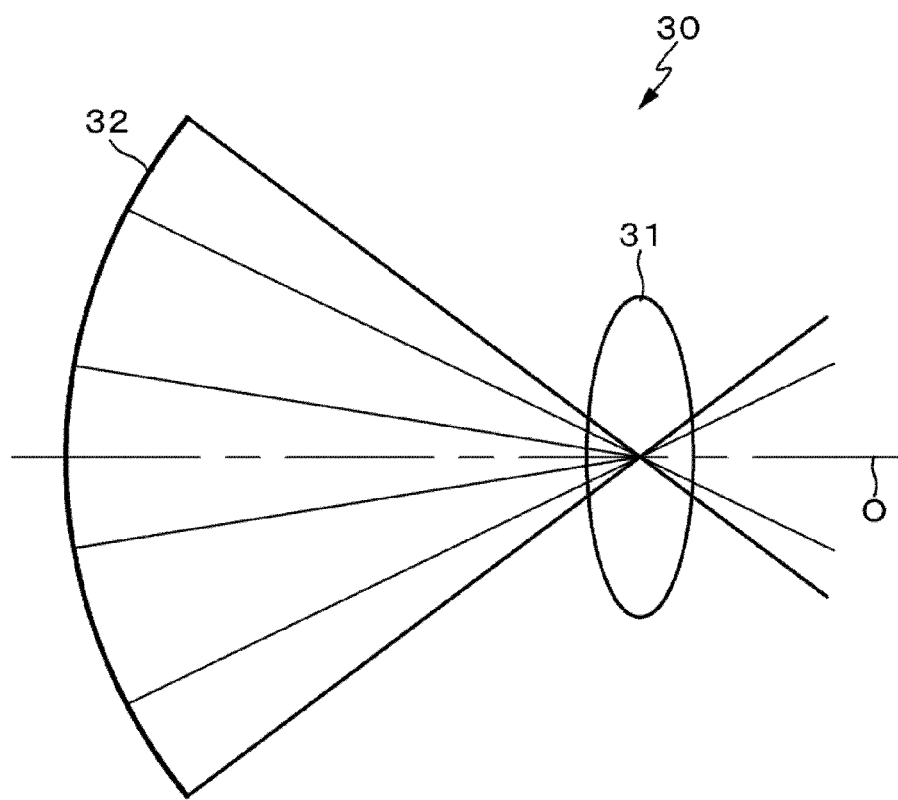
FIG. 11 is a schematic configuration diagram of a light receiving element according to Example 6.

Further, in a distance measurement device that irradiates the measurement target while scanning laser light at an equiangular pitch, the light receiving surface of the light receiving element 32 may be curved with respect to the optical axis O of the laser light receiving unit 30 as shown in FIG. 11, so that the pitch of the unit pixels 50 corresponds to the angular pitch of the laser light. With this arrangement, the amount of change in the pitch of the unit pixels 50 can be reduced. It is possible to curve the light receiving surface of the light receiving element 32 by bending the chip (the substrate) of the light receiving element 32, for example.

<Mobile Apparatus According to the Present Disclosure>

A distance measurement device according to the present disclosure may be mounted and used in any kind of mobile apparatus, such as an automobile, an electric vehicle, a hybrid electric vehicle, a motorcycle, a bicycle, a personal mobility device, an airplane, a drone, a vessel, a robot, a construction machine, or an agricultural machine (a tractor), for example.

Specific Example

Figure 12:
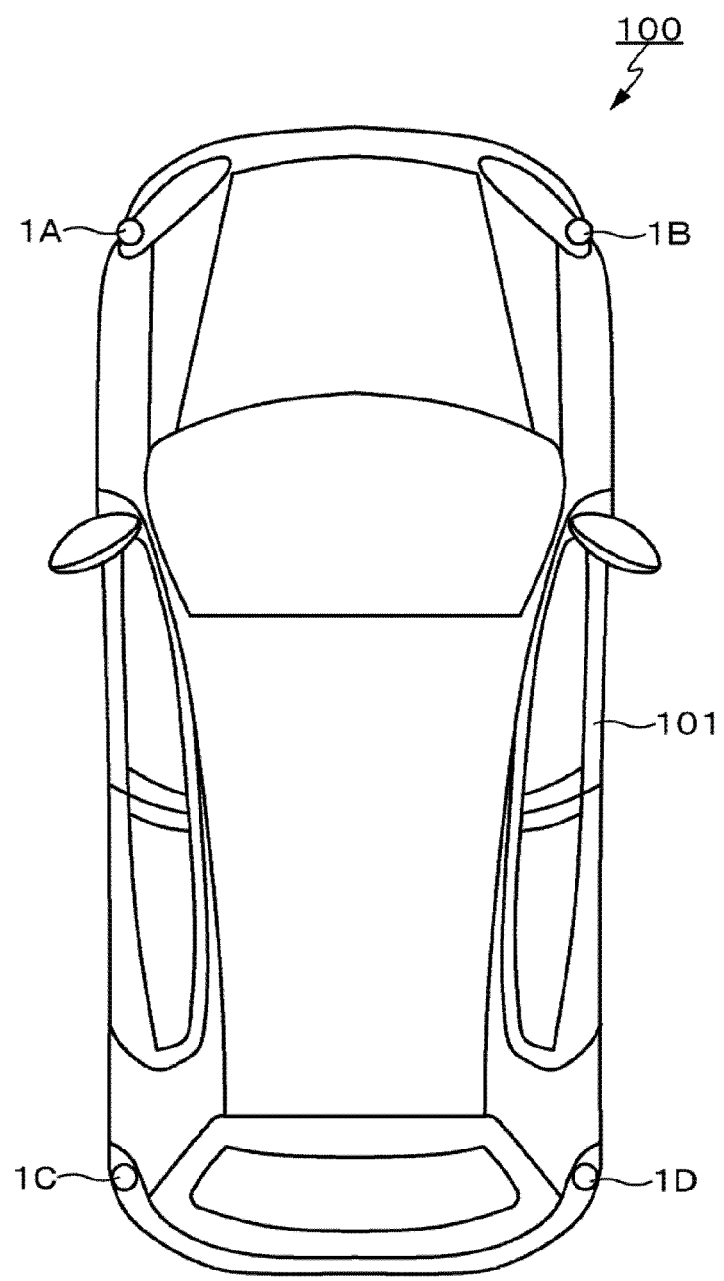
FIG. 12 is a schematic plan view of an automobile that is an example of a mobile apparatus of the present disclosure equipped with distance measurement devices.

An automobile is described herein as a specific example of a mobile apparatus. FIG. 12 is a schematic plan view of an automobile that is an example of a mobile apparatus of the present disclosure equipped with distance measurement devices.

As shown in FIG. 12, for the purpose of automatic driving or the like, an automobile 100 is equipped with distance measurement devices 1A, 1B, 1C, and 1B at a total of four locations that are two front locations and two rear locations of a vehicle body 101, for example. Note that the positions and the number of the distance measurement devices 1 shown herein are merely examples, and the present disclosure is not limited to these examples. In a case where the purpose is automatic driving or the like, a 360-degree ranging field of view (imaging field of view) FoV is required, and therefore, the distance measurement devices 1A, 1B, 1C, and 1B divide and share the 360-degree ranging field of view FoV.

Then, the distance measurement device 1A on the left front side measures the distances to automobiles running in front and to the left thereof, and measures the distances to obstacles or the like existing in front and to the left thereof. The distance measurement device 1B on the right front side measures the distances to automobiles running in front and to the right thereof, and measures the distances to obstacles or the like existing in front and to the right thereof.

The distance measurement device 1C on the left rear side measures the distances to automobiles running behind and to the left thereof, and measures the distances to obstacles or the like existing behind and to the left thereof. The distance measurement device 1D on the right rear side measures the distances to automobiles running behind and to the right thereof, and measures the distances to obstacles or the like existing behind and to the right thereof.

The distance measurement device 1 according to the present disclosure can be used as the distance measurement devices 1A, 1B, 1C, and 1B. As described above, in the distance measurement device 1 according to the present disclosure, the pitch of the unit pixels of the light receiving element varies with location in the light receiving pixel area. As a result, the difference in sensitivity between the central portion and the peripheral portion of the light receiving element can be reduced. Thus, a wide viewing angle can be achieved for a measurable distance. Accordingly, as the distance measurement device 1 of the present disclosure is used as the distance measurement devices 1A, 1B, 1C, and 1B in the automobile 100 for automatic driving or the like, it is possible to more accurately measure the distances to automobiles running nearby and distances to obstacles or the like located nearby. This contributes to construction of a safer automatic driving system or the like.

<Configurations Embodying the Present Disclosure>

Note that the present disclosure may also be embodied in the configurations described below.

<<A. Distance Measurement Device>>

[A-1] A distance measurement device including:

a laser irradiation unit configured to irradiate a measurement target with laser light; and a laser light receiving unit including a light receiving element that receives laser light reflected by the measurement target on a pixel-by-pixel basis, in which a pitch of unit pixels of the light receiving element varies with location in a light receiving pixel area.

[A-2] The distance measurement device according to [A-1], in which the pitch of the unit pixels is wider at a position that is farther away from a central portion and is closer to a peripheral portion of the light receiving element.

[A-3] The distance measurement device according to [A-1] or [A-2], in which the pitch of the unit pixels varies on a pixel-by-pixel basis.

[A-4] The distance measurement device according to [A-1] or [A-2], in which, when a plurality of adjacent unit pixels forms one block, the pitch of the unit pixels varies on a block-by-block basis.

[A-5] The distance measurement device according to any one of [A-2] to [A-4], in which, when the light receiving element is a two-dimensional array sensor in which the unit pixels are two-dimensionally arranged in a first direction and a second direction intersecting the second direction, the pitch of the unit pixels of the light receiving element varies at least in one of the first direction and the second direction.

[A-6] The distance measurement device according to any one of [A-1] to [A-5], in which sizes of the unit pixels of the light receiving element vary with location in the light receiving pixel area.

[A-7] The distance measurement device according to any one of [A-1] to [A-6], in which, the laser light receiving unit has, for respective pixels, circuit portions that process signals of the respective unit pixels of the light receiving element, the unit pixels are formed on a first substrate, and the circuit portions are formed on a second substrate stacked on the first substrate.

[A-8] The distance measurement device according to [A-7], in which the pitch of the unit pixels formed on the first substrate differs from a pitch of the circuit portions formed on the second substrate.

[A-9] The distance measurement device according to [A-1], in which the light receiving element is formed with a plurality of sub-pixels arranged at a constant pitch, a unit pixel is formed with an appropriate number of sub-pixels adjacent to one another in the plurality of sub-pixels, and the pitch of the unit pixel is determined by the pitch of the sub-pixels and the number of the sub-pixels constituting the unit pixel.

[A-10] The distance measurement device according to [A-1], in which the laser irradiation unit irradiates the measurement target while scanning laser light at an equiangular pitch, and the unit pixels are arranged in a pitch array corresponding to the equiangular pitch of the laser light.

[A-11] The distance measurement device according to [A-10], in which the light receiving element has a light receiving surface curved with respect to an optical axis of the laser light receiving unit.

<<B. Mobile Apparatus>>

[B-1] A mobile apparatus equipped with a distance measurement device, the distance measurement device including:

a laser irradiation unit configured to irradiate a measurement target with laser light; and a laser light receiving unit including a light receiving element that receives laser light reflected by the measurement target on a pixel-by-pixel basis, in which a pitch of unit pixels of the light receiving element varies with location in a light receiving pixel area.

[B-2] The mobile apparatus according to [B-1], in which the pitch of the unit pixels is wider at a position that is farther away from a central portion and is closer to a peripheral portion of the light receiving element.

[B-3] The mobile apparatus according to [B-1] or [B-2], in which the pitch of the unit pixels varies on a pixel-by-pixel basis.

[B-4] The mobile apparatus according to [B-1] or [B-2],
in which, when a plurality of adjacent unit pixels forms one block, the pitch of the unit pixels varies on a block-by-block basis.

[B-5] The mobile apparatus according to any one of [B-2] to [B-4],
in which, when the light receiving element is a two-dimensional array sensor in which the unit pixels are two-dimensionally arranged in a first direction and a second direction intersecting the second direction,
the pitch of the unit pixels of the light receiving element varies at least in one of the first direction and the second direction.

[B-6] The mobile apparatus according to any one of [B-1] to [B-5],
in which sizes of the unit pixels of the light receiving element vary with location in the light receiving pixel area.

[B-7] The mobile apparatus according to any one of [B-1] to [B-6],
in which the laser light receiving unit has, for respective pixels, circuit portions that process signals of the respective unit pixels of the light receiving element,
the unit pixels are formed on a first substrate, and
the circuit portions are formed on a second substrate stacked on the first substrate.

[B-8] The mobile apparatus according to [B-7],
in which the pitch of the unit pixels formed on the first substrate differs from a pitch of the circuit portions formed on the second substrate.

[B-9] The mobile apparatus according to [B-1],
in which the light receiving element is formed with a plurality of sub-pixels arranged at a constant pitch,
a unit pixel is formed with an appropriate number of sub-pixels adjacent to one another in the plurality of sub-pixels, and
the pitch of the unit pixel is determined by the pitch of the sub-pixels and the number of the sub-pixels constituting the unit pixel.

[B-10] The mobile apparatus according to [B-1],
in which the laser irradiation unit irradiates the measurement target while scanning laser light at an equiangular pitch, and
the unit pixels are arranged in a pitch array corresponding to the equiangular pitch of the laser light.

[B-11] The mobile apparatus according to [B-10],
in which the light receiving element has a light receiving surface curved with respect to an optical axis of the laser light receiving unit.

REFERENCE SIGNS LIST

1 Distance measurement device
10 Measurement target
20 Laser irradiation unit
21 Laser driver
22 Laser light source
23 Diffusion lens
24 Beam scanning unit
25 Mirror
30 Laser light receiving unit
31 Light receiving lens
32 Light receiving element
33 Light receiving circuit
40 Control unit
50 Unit pixel
51 Sub-pixel
61 First substrate
62 Second substrate

The invention claimed is:

1. A distance measurement device comprising:
a laser irradiator configured to irradiate a measurement target with laser light; and
a laser light receiver including a light receiving element that receives laser light reflected by the measurement target on a pixel-by-pixel basis, wherein
a pitch of pixels of the light receiving element varies with location in a light receiving pixel area.

2. The distance measurement device according to claim 1, wherein
the pitch of the pixels is wider at a position that is farther away from a central portion of the light receiving element and is closer to a peripheral portion of the light receiving element.

3. The distance measurement device according to claim 1, wherein
the pitch of the pixels varies on a pixel-by-pixel basis.

4. The distance measurement device according to claim 2, wherein
the light receiving element is a two-dimensional array sensor in which the pixels are two-dimensionally arranged in a first direction and a second direction intersecting the second direction, and the pitch of the pixels of the light receiving element varies at least in one of the first direction and the second direction.

5. The distance measurement device according to claim 1, wherein
sizes of the pixels of the light receiving element vary with location in the light receiving pixel area.

6. The distance measurement device according to claim 1, wherein
the laser light receiver includes circuit portions that process signals of respective pixels of the light receiving element, the pixels are formed on a first substrate, and the circuit portions are formed on a second substrate stacked on the first substrate.

7. The distance measurement device according to claim 6, wherein
the pitch of the pixels formed on the first substrate differs from a pitch of the circuit portions formed on the second substrate.

8. The distance measurement device according to claim 1, wherein
the pixels respectively include a number of sub-pixels, and
the pitch of the pixels is determined by the pitch of the sub-pixels and the number of sub-pixels.

9. The distance measurement device according to claim 1, wherein
the laser irradiator irradiates the measurement target while scanning laser light at an equiangular pitch, and
the pixels are arranged in a pitch array corresponding to the equiangular pitch of the laser light.

10. The distance measurement device according to claim 9, wherein
the light receiving element has a light receiving surface curved with respect to an optical axis of the laser light receiver.

11. A mobile apparatus comprising a distance measurement device, the distance measurement device including:
a laser irradiator configured to irradiate a measurement target with laser light; and a laser light receiver including a light receiving element that receives laser light reflected by the measurement target on a pixel-by-pixel basis, wherein a pitch of pixels of the light receiving element varies with location in a light receiving pixel area.

12. The mobile apparatus according to claim 11, wherein the pitch of the pixels is wider at a position that is farther away from a central portion of the light receiving element and is closer to a peripheral portion of the light receiving element.

13. The mobile apparatus according to claim 11, wherein the pitch of the pixels varies on a pixel-by-pixel basis.

14. The mobile apparatus according to claim 12, wherein the light receiving element is a two-dimensional array sensor in which the pixels are two-dimensionally arranged in a first direction and a second direction intersecting the second direction, and the pitch of the pixels of the light receiving element varies at least in one of the first direction and the second direction.

15. The mobile apparatus according to claim 11, wherein sizes of the pixels of the light receiving element vary with location in the light receiving pixel area.

16. The mobile apparatus according to claim 11, wherein the laser light receiver includes circuit portions that process signals of respective pixels of the light receiving element, the pixels are formed on a first substrate, and the circuit portions are formed on a second substrate stacked on the first substrate.

17. The mobile apparatus according to claim 16, wherein the pitch of the pixels formed on the first substrate differs from a pitch of the circuit portions formed on the second substrate.

18. The mobile apparatus according to claim 11, wherein the pixels respectively include a number of sub-pixels, and the pitch of the pixels is determined by the pitch of the sub-pixels and the number of sub-pixels.

19. The mobile apparatus according to claim 11, wherein the laser irradiator irradiates the measurement target while scanning laser light at an equiangular pitch, and the pixels are arranged in a pitch array corresponding to the equiangular pitch of the laser light.

20. The mobile apparatus according to claim 19, wherein the light receiving element has a light receiving surface curved with respect to an optical axis of the laser light receiver.

* * * * *